(12) United States Patent
Hashimoto

(10) Patent No.: US 7,598,619 B2
(45) Date of Patent: Oct. 6, 2009

(54) ELECTRONIC COMPONENT AND SEMICONDUCTOR DEVICE, METHOD OF FABRICATING THE SAME, CIRCUIT BOARD MOUNTED WITH THE SAME, AND ELECTRONIC APPLIANCE COMPRISING THE CIRCUIT BOARD

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/230,681

(22) Filed: Sep. 3, 2008

(65) Prior Publication Data

US 2009/0026631 A1    Jan. 29, 2009

Related U.S. Application Data

(60) Division of application No. 11/513,168, filed on Aug. 31, 2006, now Pat. No. 7,436,071, which is a division of application No. 11/274,150, filed on Nov. 16, 2005, now Pat. No. 7,119,445, which is a division of application No. 10/918,449, filed on Aug. 16, 2004, now Pat. No. 6,989,605, which is a continuation of application No. 10/316,052, filed on Dec. 11, 2002, now Pat. No. 6,803,663, which is a continuation of application No. 09/180,225, filed as application No. PCT/JP98/00973 on Mar. 10, 1998, now Pat. No. 6,515,370.

(30) Foreign Application Priority Data

Mar. 10, 1997    (JP)    ................................... 9-072614

(51) Int. Cl.
| | |
|---|---|
| H01L 23/52 | (2006.01) |
| H01L 23/48 | (2006.01) |
| H01L 29/40 | (2006.01) |
| H01L 27/146 | (2006.01) |
| H01L 27/148 | (2006.01) |
| H01L 21/50 | (2006.01) |
| H01L 21/48 | (2006.01) |
| H01L 21/44 | (2006.01) |

(52) U.S. Cl. ................. 257/777; 257/685; 257/686; 257/E27.137; 257/E27.144; 257/E27.161; 438/109; 438/107; 438/108

(58) Field of Classification Search ................ 257/685, 257/686, 777, E27.137, E27.144, E27.161; 438/109, 107, 108
See application file for complete search history.

(56) References Cited

U.S. PATENT DOCUMENTS 5,136,365 A     8/1992    Pennisi et al.

(Continued)

FOREIGN PATENT DOCUMENTS

EP         0 348 972 A2     1/1990

(Continued)

OTHER PUBLICATIONS

G. Rochat, "COB and COC for Low Cost and High Density Package", *IEEE/CPMT International Electronics Manufacturing Technology Symposium*, vol. SYMP. 17, 1995, pp. 109-111.

(Continued)

*Primary Examiner*—Luan C Thai
(74) *Attorney, Agent, or Firm*—Oliff & Berridge, PLC

(57) ABSTRACT

An integrated type semiconductor device that is capable of reducing cost or improving the reliability of connecting semiconductor chips together or chips to a circuit board. One embodiment of such an integrated type semiconductor device comprises a first semiconductor device (10) having a semiconductor chip (12) with electrodes (16), a stress-relieving layer (14) prepared on the semiconductor chip (12), a wire (18) formed across the electrodes (16) and the stress-relieving layer (14), and solder balls (19) formed on the wire (18) over the stress-relieving layer (14); and a bare chip (20) as a second semiconductor device to be electrically connected to the first semiconductor device (10).

10 Claims, 9 Drawing Sheets

U.S. PATENT DOCUMENTS

| | | | |
|---|---|---|---|
| 5,148,265 | A | 9/1992 | Khandros et al. |
| 5,173,764 | A | 12/1992 | Higgins |
| 5,366,933 | A | 11/1994 | Golwalkar et al. |
| 5,376,825 | A | 12/1994 | Tukamoto et al. |
| 5,399,898 | A | 3/1995 | Rostoker |
| 5,477,611 | A | 12/1995 | Sweis et al. |
| 5,677,567 | A | 10/1997 | Ma et al. |
| 5,753,974 | A | 5/1998 | Masukawa |
| 5,767,009 | A | 6/1998 | Yoshida et al. |
| 5,773,896 | A | 6/1998 | Fujimoto et al. |
| 5,776,796 | A | 7/1998 | Distefano et al. |
| 5,821,625 | A | 10/1998 | Yoshida et al. |
| 5,915,169 | A | 6/1999 | Heo |
| 5,917,242 | A | 6/1999 | Ball |
| 5,930,599 | A * | 7/1999 | Fujimoto et al. ............ 438/113 |
| 5,963,794 | A * | 10/1999 | Fogal et al. ................. 438/108 |
| 5,966,587 | A | 10/1999 | Karavakis et al. |
| 5,990,545 | A | 11/1999 | Schueller et al. |
| 6,054,337 | A | 4/2000 | Solberg |
| 6,057,598 | A | 5/2000 | Payne et al. |
| 6,803,663 | B2 | 10/2004 | Hashimoto |
| 6,989,605 | B2 | 1/2006 | Hashimoto |

FOREIGN PATENT DOCUMENTS

| | | |
|---|---|---|
| EP | 0 736 903 A2 | 10/1996 |
| JP | 53-037383 | 4/1978 |
| JP | A-53-37383 | 4/1978 |
| JP | A 53-039068 | 4/1978 |
| JP | A-58-140143 | 8/1983 |
| JP | A-59-052859 | 3/1984 |
| JP | A-59-210649 | 11/1984 |
| JP | A-59-218744 | 12/1984 |
| JP | A-60-150668 | 8/1985 |
| JP | A-61-89657 | 5/1986 |
| JP | A-63-142663 | 6/1988 |
| JP | 01-209746 | 8/1989 |
| JP | A-02-241045 | 9/1990 |
| JP | 4-158565 | 6/1992 |
| JP | A-05-129373 | 5/1993 |
| JP | A-05-129516 | 5/1993 |
| JP | 06-037233 | 2/1994 |
| JP | 06-132474 | 5/1994 |
| JP | 06-209071 | 7/1994 |
| JP | A-6-209071 | 7/1994 |
| JP | A-6-224334 | 8/1994 |
| JP | A-07-263620 | 10/1995 |
| JP | A 08-045990 | 2/1996 |
| JP | 08-213427 | 8/1996 |
| JP | 08-222571 | 8/1996 |
| JP | A-8-203906 | 8/1996 |
| JP | 08-330313 | 12/1996 |
| JP | A-9-17945 | 1/1997 |
| JP | A 08-064049 | 3/1997 |
| JP | A-10-032307 | 2/1998 |

OTHER PUBLICATIONS

T.D. Dudderar et al., "AT&T Surface μMount Assembly: A New Technology for the Large Volume Fabrication of Cost Effective Flip-Chip MCMs," International Journal of Microcircuits and Electronic Packaging, International Microelectronics & Packaging Society, US, vol. 17, No. 4, pp. 361-367, Oct. 1, 1994.

T.D. Dudderar et al., "Shell and Gel BGA Packaging of Bell Laboratories Muinterconnect Multichip Modules," International Journal of Microcircuits and Electronic Packaging, International Microelectronics & Packaging Society, US, vol. 19, No. 2, pp. 110-119, Apr. 1, 1996.

* cited by examiner

ELECTRONIC COMPONENT AND SEMICONDUCTOR DEVICE, METHOD OF FABRICATING THE SAME, CIRCUIT BOARD MOUNTED WITH THE SAME, AND ELECTRONIC APPLIANCE COMPRISING THE CIRCUIT BOARD

CROSS-REFERENCE TO RELATED APPLICATION

This is a Divisional of application Ser. No. 11/513,168 filed Aug. 31, 2006, now U.S. Pat. No. 7,436,071 which is a Divisional of application Ser. No. 11/274,150 filed Nov. 16, 2005, now U.S. Pat. No. 7,119,445, which is a Divisional of application Ser. No. 10/918,449 filed Aug. 16, 2004, now U.S. Pat. No. 6,989,605, which is a Continuation of application Ser. No. 10/316,052 filed Dec. 11, 2002, now U.S. Pat. No. 6,803,663, which is a Continuation of application Ser. No. 09/180,225 filed Apr. 22, 1999, now U.S. Pat. No. 6,515,370, which is a National Phase of Application No. PCT/JP98/00973 filed Mar. 10, 1998. The entire disclosures of the prior applications are hereby incorporated by reference herein in their entirety.

BACKGROUND

The present invention relates to an electronic component and a semiconductor device wherein a plurality of chips are connected together, a method of fabricating the same, a circuit board mounted with the same, and an electronic appliance comprising the circuit board.

Semiconductor devices are used in a variety of applications such as logic devices, memory devices, CPUs, and the like. It is commonplace to integrate two or more types of electronic circuits into one semiconductor device. To do this, however, requires redesigning of the semiconductor device with added cost. It has therefore been common practice to connect a plurality of semiconductor chips for a unit of the semiconductor device. Such a semiconductor device in the prior art is fabricated by merely connecting a plurality of bare chips mounted on a circuit board through soldering bumps prepared on anyone of the bare chips.

Accordingly, the prior art such as described above lacked ingenuity in connecting the bare chips together, or in the mounting of the semiconductor device onto a circuit board.

For instance, to connect two bare chips together a bonding pad for connecting electrodes on one of the bare chips must be prepared on the other bare chip. This required redesigning of the bare chip.

Otherwise, when the bare chips were mounted on a circuit board by directly connecting any of the bare chips to a circuit board, cracks sometimes developed at the connections due to the difference in the thermal expansion coefficients of the bare chip and the circuit board.

Accordingly, with an aim at eliminating the above-described problems of the prior art, it is an object of the present invention to provide an electronic component and a semiconductor device that are capable of reducing cost or improving reliability in the connecting of chips to each other or to a circuit board, a method of fabricating the same, a circuit board mounted with the same, and an electronic appliance comprising the circuit board.

SUMMARY (1) An integrated type semiconductor device of the present invention comprises a first semiconductor device having a semiconductor chip with first electrodes, a stress relieving structure provided on the semiconductor chip, a plurality of wires formed from the first electrodes, and external electrodes formed on the stress relieving structure and connected to any ones of the wires; and, a second semiconductor device having second electrodes arranged with a different spacing pitch in comparison with the first electrodes on the first semiconductor device, the second semiconductor device being electrically connected to any ones of the wires of the first semiconductor device.

In accordance with the present invention, the first semiconductor device and the second semiconductor device are connected to form an integrated type semiconductor device. Since the first semiconductor device has a stress relieving structure, any stress placed on the external electrodes can be relieved by the stress relieving structure. In other words, while bonding of the external electrodes of the first semiconductor device onto bonding pads or the like of a circuit board could create stress due to a difference in the thermal expansion coefficient of the semiconductor chip and the circuit board, such stress is relieved by the stress relieving structure.

Additionally, in preparing electrodes for a semiconductor chip, it is generally preferable to design them in the best position for that particular chip. In this case, if the electrode positions of the semiconductor chip in the first semiconductor device differ from those of the second semiconductor device having a semiconductor chip with electrodes located at positions different from the first semiconductor chip, electrodes must be designed so that the electrode positions of both units meet together to form an integrated (united) device. However, with the present invention, semiconductor chips with unmatched electrode positions can be made into an integrated semiconductor device by arranging of the wires as necessary to convert the spacing pitch.

(2) The stress relieving structure may comprise a stress relieving layer provided on the semiconductor chip, whereas the ones of the wires connected to the external electrodes may be formed extending from the first electrodes to an area on the stress relieving layer, and the external electrodes may be formed on the ones of the wires connected to the external electrodes on the stress relieving layer.

(3) The stress relieving structure may comprise a stress relieving layer provided on the semiconductor chip and connecting portions piercing through the stress relieving layer and transmitting stress to the stress relieving layer, whereas the ones of the wires connected to the external electrodes may be formed beneath the stress relieving layer, and the external electrodes may be formed on the connecting portions.

(4) The second semiconductor device may be a bare chip consisting of a semiconductor chip having the second electrodes and external electrodes prepared on the second electrodes.

In accordance with this description, the second semiconductor device is a so-called bare chip to be connected to the first semiconductor device by means of flip chip bonding. Using a bare chip as the second semiconductor device such as described above dispenses with additional processing and therefore enables reductions in cost as well as fabrication steps.

(5) The second semiconductor device may comprise a semiconductor chip having the second electrodes, a stress relieving layer provided on the semiconductor chip, and wires formed extending from the second electrodes to an area on the stress relieving layer, and external electrodes formed on the wires on the stress relieving layer.

In accordance with this description, not only the first semiconductor device but also the second semiconductor device is enabled to relieve stress by a stress relieving layer.

(6) The second semiconductor device may comprise a semiconductor chip having the second electrodes, a stress relieving layer provided on the semiconductor chip, wires formed underneath the stress relieving layer from the second electrodes, connecting portions piercing through the stress relieving layer and transmitting stress to the stress relieving layer, and external electrodes formed on the connecting portions.

(7) The second semiconductor device may comprise wires formed from the second electrodes and external electrodes formed on the wires, whereas the external electrodes of the second semiconductor device may be electrically connected to the first semiconductor device.

(8) The wires connected to the second semiconductor device may be formed on the semiconductor chip, whereas the second semiconductor device may comprise wires formed from the second electrodes and external electrodes formed on the wires, and the stress relieving layer may be formed in a region avoiding at least a part of the ones of the wires connected to the second semiconductor device.

In accordance with this description, since the stress relieving layer is formed only in a region avoiding at least a portion of the wires, this reduces the area for forming the stress relieving layer.

(9) The ones of the wires connected to the second semiconductor device may be formed on the stress relieving layer, whereas the second semiconductor device may comprise wires formed from the second electrodes and external electrodes formed on the wires.

In accordance with this description, since the wires connected to the second semiconductor device is formed on the stress relieving layer, it can be made into any desired shape without need for redesigning of the semiconductor chip. It therefore makes it possible to configure the first semiconductor device by utilizing an existing semiconductor device, thereby avoiding cost increase.

(10) The ones of the wires connected to the second semiconductor device may be formed on the semiconductor chip, whereas the second semiconductor device may comprise wires formed from the second electrodes and external electrodes formed on the wires, and the stress relieving layer may be formed in a region avoiding at least a part of the ones of the wires connected to the second semiconductor device.

(11) The ones of the wires connected to the second semiconductor device may be formed on the stress relieving layer, whereas the second semiconductor device may comprise wires formed from the second electrodes and external electrodes formed on the wires.

(12) The integrated type semiconductor device may further comprise at least one third semiconductor device electrically connected to the first semiconductor device.

In accordance with this method, at least three semiconductor devices can be connected to form an integrated type semiconductor device.

(13) The integrated type semiconductor device may further comprise a plastic package to seal both the first and second semiconductor devices, and outer leads connected to the first electrodes of the first semiconductor device.

Such a semiconductor device is referred to as a resin sealed type device.

(14) The first semiconductor device may be equipped with a radiator attached to a side opposite to a side to which the second semiconductor device is connected.

Such a configuration provides for heat radiation of semiconductor chip of the first semiconductor device.

(15) An integrated type electronic component of the present invention comprises a first electronic component having an element chip with first electrodes, a stress relieving structure provided on the element chip, a plurality of wires formed from the first electrodes, and external electrodes formed on the stress relieving structure and connected to any ones of the wires; and, a second electronic component having second electrodes arranged with a different spacing pitch in comparison with the first electrodes on the first electronic component, the second electronic component being electrically connected to any ones of the wires of the first electronic component.

(16) A method of making an integrated type electronic component in accordance with the present invention comprises steps of electrically connecting a second electronic component to a first electronic component having an element chip with first electrodes, a stress relieving structure provided on the element chip, a plurality of wires formed from the first electrodes, and external electrodes formed on the stress relieving structure and connected to any ones of the wires, the connection being achieved through any ones of the wires.

(17) A method of making an integrated type semiconductor device in accordance with the present invention comprises steps of electrically connecting a second semiconductor device to a first semiconductor device having a semiconductor chip with first electrodes, a stress relieving structure provided on the semiconductor chip, a plurality of wires formed from the first electrodes, and external electrodes formed on the stress relieving structure and connected to any ones of the wires, the connection being achieved through any ones of the wires.

The aforementioned integrated type semiconductor device can be fabricated in accordance with the above steps.

(18) The ones of the wires connected to the second semiconductor device may have pads and be formed on the semiconductor chip, whereas the stress relieving structure may comprise a stress relieving layer provided in a region avoiding the pads, and the second semiconductor device may possess second electrodes, wires formed from the second electrodes, and external electrodes formed on the wires; the external electrodes of the second semiconductor device may be connected to the pads of the first semiconductor device.

(19) The stress relieving structure may comprise a stress relieving layer provided on the semiconductor chip, whereas the ones of the wires connected with the second semiconductor device may have pads and be formed on the stress relieving layer, and the second semiconductor device may possess second electrodes, wires formed from the second electrodes, and external electrodes formed on the wires; the external electrodes of the second semiconductor device may be connected to the pads of the first semiconductor device.

(20) At least ones of the pads of the first semiconductor device and the external electrodes of the second semiconductor device may be made from solder having a higher melting point than that used for mounting use onto a circuit board.

The above ensures that the solder bonding the pads and the external electrodes does not remelt to break down the bonding, even at a temperature when the solder, used for mounting the integrated type semiconductor device onto the circuit board, is melted in a reflow step.

(21) The pads of the first semiconductor device and the external electrodes of the second semiconductor device may be made from metal having a higher melting point than that of solder.

In accordance with this method, the pads and bumps are bonded together between the metal on the surface of the pads and the metal on the surface of the external electrodes. Since the melting points of these metals are higher than that of solder, the metals bonding the pads and the external electrodes do not remelt to break down the bonding, even if the solder, used for mounting the integrated type semiconductor device onto the circuit board, is melted in a reflow step.

(22) Sides of ones of the pads of the first semiconductor device and the external electrodes of the second semiconductor device may be made from solder and sides of others may be made from metal having a higher melting point than that of solder.

In accordance with this method, when the solder on one of the surfaces is melted to bond the connection, the metal on the other side diffuses into the solder to raise the solder remelting temperature. This ensures that the solder bonding the pads and the external electrodes does not remelt to break down the bonding, even at a temperature when the solder, used for mounting the integrated type semiconductor device onto the circuit board, is melted in a reflow step.

(23) Between the pads of the first semiconductor device and the external electrodes of the second semiconductor device, an anisotropic conductive layer containing thermosetting adhesive may be placed, and the external electrodes of the second semiconductor device and the pads of the first semiconductor device may be bonded through the anisotropic conductive layer.

In accordance with this method, since the anisotropic conductive layer contains thermosetting adhesive, which hardens at a temperature when the solder, used for mounting the integrated type semiconductor device onto the circuit board, is melted in a reflow step, the bonding between the pads and the external electrodes is prevented from breaking down.

(24) On a circuit board of the present invention, the aforementioned integrated type semiconductor device is mounted.

(25) An electronic appliance according to the present invention comprises the aforementioned circuit board.

DETAILED DESCRIPTION OF EMBODIMENTS

In the following sections, preferred embodiments of the present invention are explained in more detail referring to the illustrative figures.

First Embodiment

Figure 1:
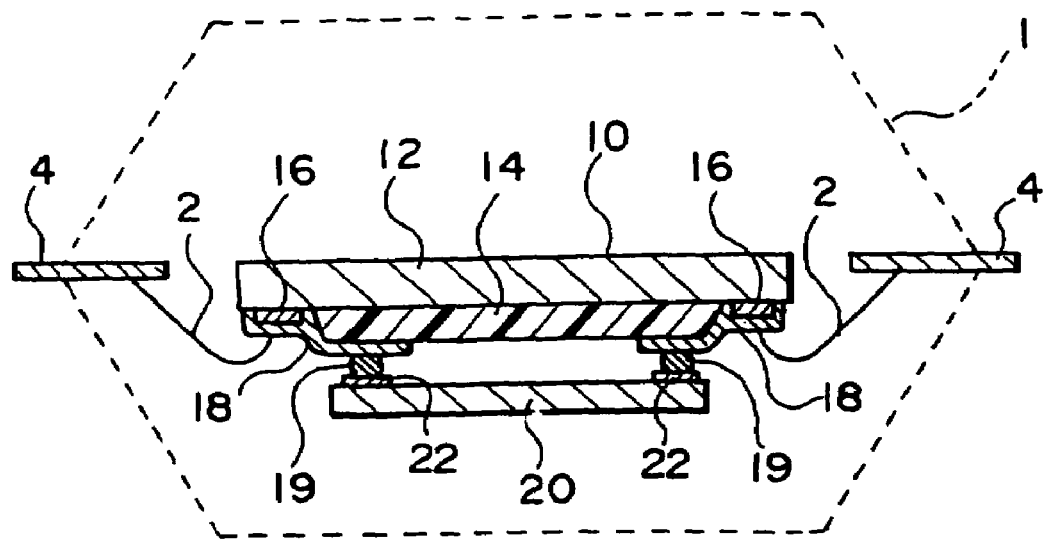
FIG. 1 shows a semiconductor device in accordance with the first embodiment.

FIG. 1 shows a semiconductor device in accordance with the first embodiment. The semiconductor device 1 is an integrated type device comprising a semiconductor device 10 and a bare chip 20 as a semiconductor device.

The semiconductor device 10 has a stress relieving layer 14 provided on the surface having an electrode 16 of a semiconductor chip 12 and in the region avoiding the electrode 16, while a wire 18 is wrapped around the electrode 16 and the stress relieving layer 14. On top of the wire 18 a solder ball 19 is formed. Since the solder ball 19 can be formed at a desired position on the wire 18, the spacing pitch can be easily converted from that of the electrode 16 to any desired pitch. Therefore, the pitch conversion for external terminals is easily accomplished.

In addition, as the stress relieving layer 14, materials having a low Young's modulus capable of relieving stress are used. For such materials, polyimide resins, silicone-modified polyimide resins, epoxy resins, silicone-modified epoxy resins, and the like can be mentioned as examples. Accordingly, the stress relieving layer 14 can relieve outside stress applied to the solder ball 19.

Furthermore, an electrode 22 of the bare chip 20 is connected to the solder ball 19. Note that the solder ball 19 may be formed beforehand on the electrode 16 of the semiconductor device 10, or alternatively, on the electrode 22 of the bare chip 20. In this regard, an electrical connection between the semiconductor device 10 and the bare chip 20 is possible since the pitch conversion for the external terminals of the semiconductor device 10 is easily accomplished.

On the semiconductor chip 12 of the semiconductor device 10, a wire 2 is bonded to an electrode (not shown in the illustration) on which the wire 18 is not provided, and connected to a lead 4. Finally, by sealing the entire region encompassed by the double-dot-and-dash line in the illustration with plastic, the semiconductor device 1 is obtained.

According to the present embodiment, a new integrated circuit can be easily formed by combining the existing bare chip 20 with the semiconductor device 10. As examples of the specific functions of the semiconductor device 10 and the bare chip 20, combinations such as a logic device and a memory device (RAM), a CPU and a memory device (SRAM), and the like can be mentioned.

Although a "QFP" packaging form is mentioned in the present embodiment by way of example, the form of packaging is not limited thereto.

While it is preferred that the present invention is applied to semiconductor devices of different types, it could well be applied equally to semiconductor devices of the same type.

Second Embodiment

Figure 2:
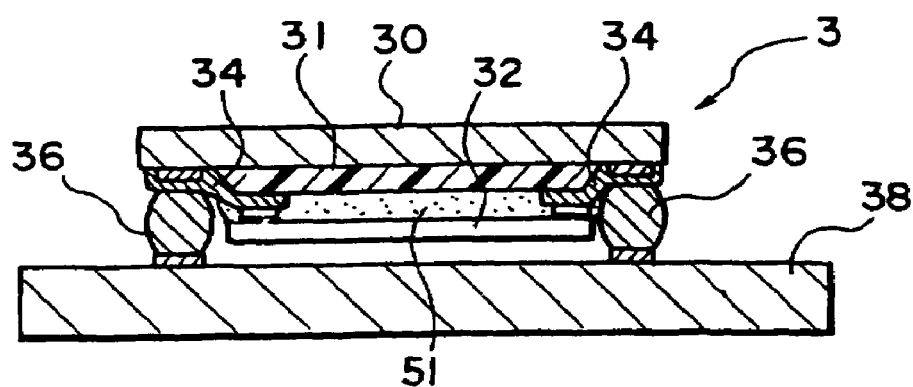
FIG. 2 shows a circuit board mounted with a semiconductor device in accordance with the second embodiment.

FIG. 2 shows a circuit board with a semiconductor device mounted in accordance with the second embodiment. The semiconductor device 3 shown in the figure is an integrated type device comprising a semiconductor device 30 having a stress relieving layer 31 and a bare chip 32 as a semiconductor device. The main configuration and the connecting methods for the semiconductor device 30 and the bare chip 32 are the same as with the semiconductor device 10 and the bare chip 20 as shown in FIG. 1. Additionally, a wire 34 of the semiconductor device 30 is mounted on a circuit board 38 through a solder bump 36.

Note that the electrode-mounted side and the bare chip 32 side are preferably protected with a resin 51.

The present embodiment, mentioned by way of example, is aimed at achieving a spacing pitch conversion between the first semiconductor device and the second semiconductor device in addition to relieving stress between them. In other words, the preferable circumstances for the application of the present embodiment are instances where there is only a small difference in the thermal expansion coefficient from that of the circuit board, or operated only in an environment with insignificant temperature fluctuations.

Third Embodiment

Figure 3:
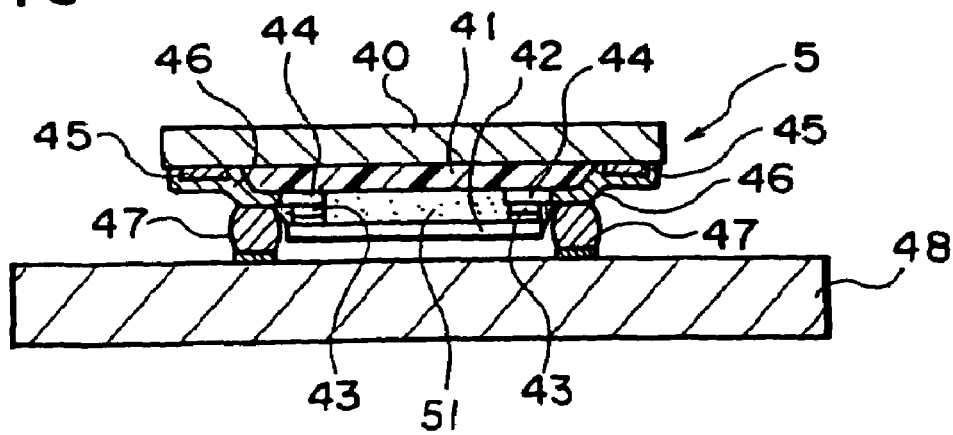
FIG. 3 shows a circuit board mounted with a semiconductor device in accordance with the third embodiment.

FIG. 3 shows a circuit board with a semiconductor device mounted in accordance with the third embodiment. The semiconductor device 5 shown in the figure is an integrated type device comprising a semiconductor device 40 and a bare chip 42 as a semiconductor device. The present embodiment is configured so that stress between the device and a circuit board 48 can be relieved.

On the semiconductor device 40, a stress relieving layer 41 with a low Young's modulus is provided in the region avoiding the electrode 45, in a similar fashion as the semiconductor device 10 shown in FIG. 1. On the stress relieving layer 41, a pad 44 is formed at a wire led from an electrode (not shown in the illustration) and is connected to the bare chip 42 through a bump 43 formed on the pad 44. Also on the stress relieving layer 41, a wire 46 led from the electrode 45 is formed, the wire 46 being connected to the circuit board 48 through a bump 47. More specifically, a pad is also formed on the wire 46 to build the bump 47 thereon.

Note that the electrode-mounted side and the bare chip 42 side are preferably protected with a resin 51.

According to the present embodiment, the stress caused by the difference in thermal expansion coefficients between the semiconductor device 40 and the circuit board 48 is relieved by the stress relieving layer 41 provided on the semiconductor device 40. Furthermore, since the wire 44 is formed on the stress relieving layer 41, it is easily adaptable and, even when a ready-made product is used as the bare chip 42, no redesigning of the semiconductor device 40 is required.

Fourth Embodiment

Figure 4A:
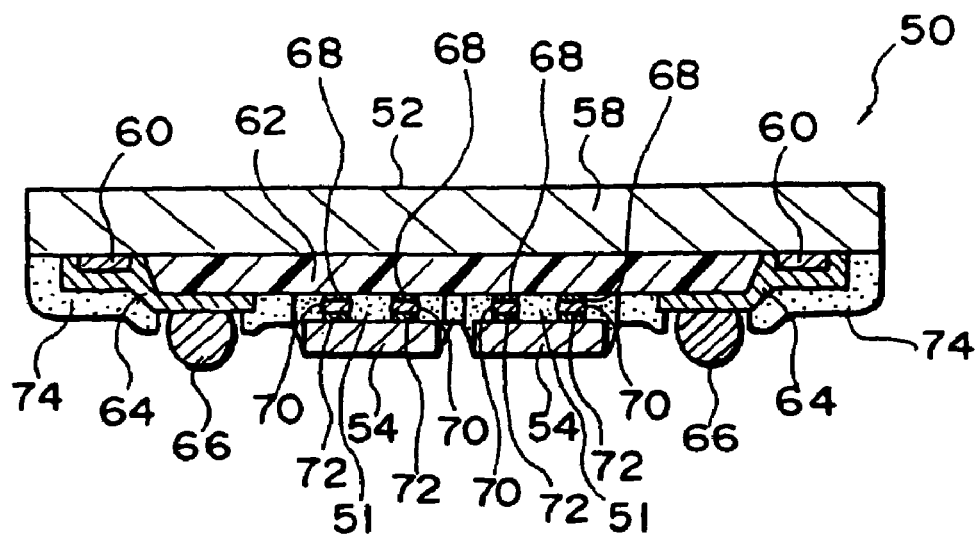
FIGS. 4A and 4B show a semiconductor device in accordance with the fourth embodiment.
Figure 4B:
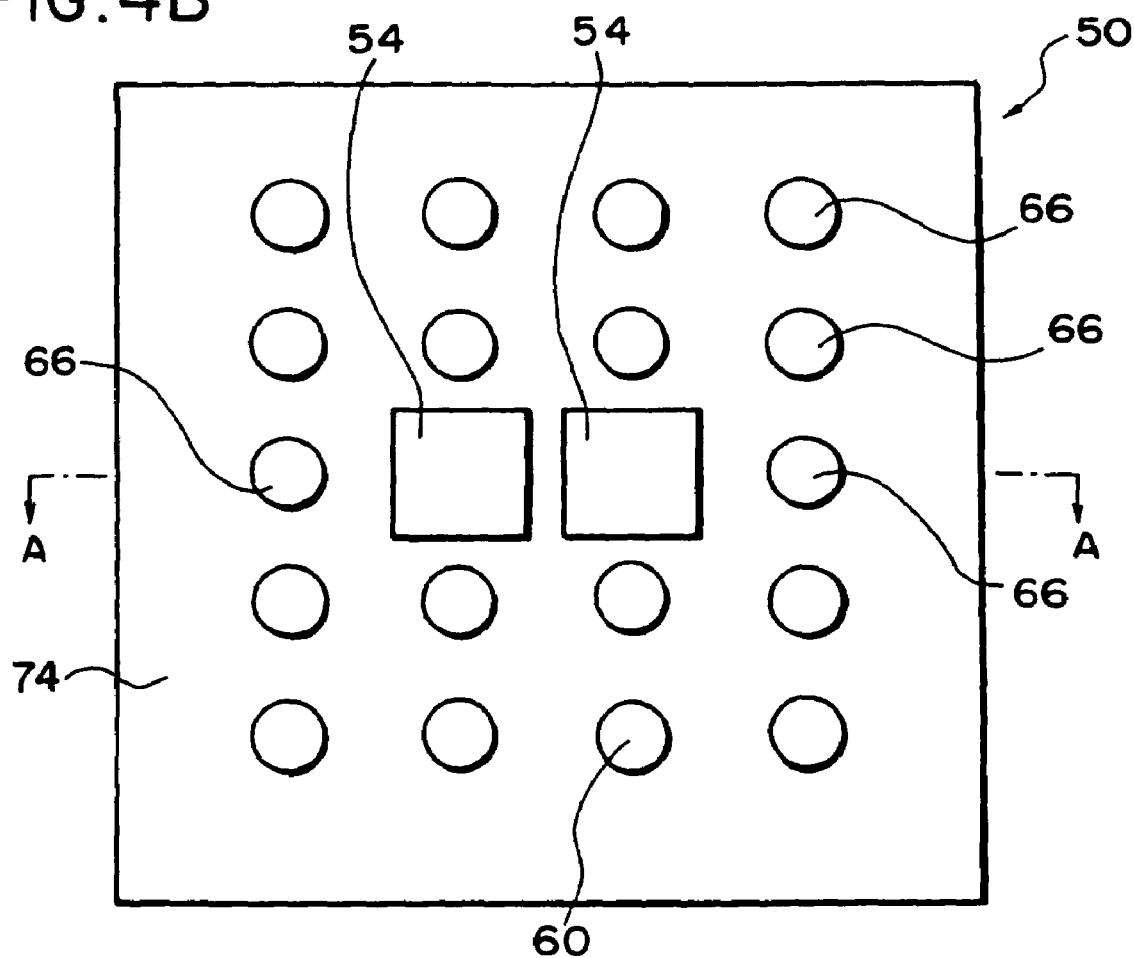

FIGS. 4A and 4B show a semiconductor device in accordance with the fourth embodiment, wherein FIG. 4B is a plain view and FIG. 4A is a cross sectional view of FIG. 4B through the A-A plane. The semiconductor device 50 shown in the figure is an integrated type device comprising a semiconductor device 52 and two bare chips 54 as semiconductor devices. As specific function for the device, a combination of a logic device, a memory device (RAM), and a CPU can be mentioned by way of example.

The semiconductor device 50 has a configuration similar to the semiconductor device 10 shown in FIG. 1. Namely, a stress relieving layer 62 is provided on the surface having an electrode 60 of a semiconductor chip 58 and in the region avoiding the electrode 60, while a wire 64 is formed across the electrode 60 and the stress relieving layer 62. On top of the wire 64 above the stress relieving layer 62, a solder bump 66 is formed.

Further, in the semiconductor device 50, a pad 68 is formed on wires led from a plurality of electrodes not shown in the illustration, the pad being connected to an electrode 72 of the bare chip 54 through a bump 70. Note that the side having the electrode 72 and the bare chip 54 side are preferably protected with a resin 51.

Additionally, on the wire 64 of the semiconductor device 50 a solder resist layer 74 is provided while avoiding the bump 66. The solder resist layer 74 acts as an oxidation preventive coating and also as a protective coating for the integrated type semiconductor device as an eventual product, or provides for a top coat aimed at improving the moisture proofing property of the product.

While two bare chips 54 are connected to the semiconductor device 52 in the present embodiment, three or more bare chips 54 may also be connected. Such a multi-chip module (MCM) that forms circuits with a plurality of bare chips can be easily designed by forming a wire 68 on top of the stress relieving layer 64.

Fifth Embodiment

Figure 5:
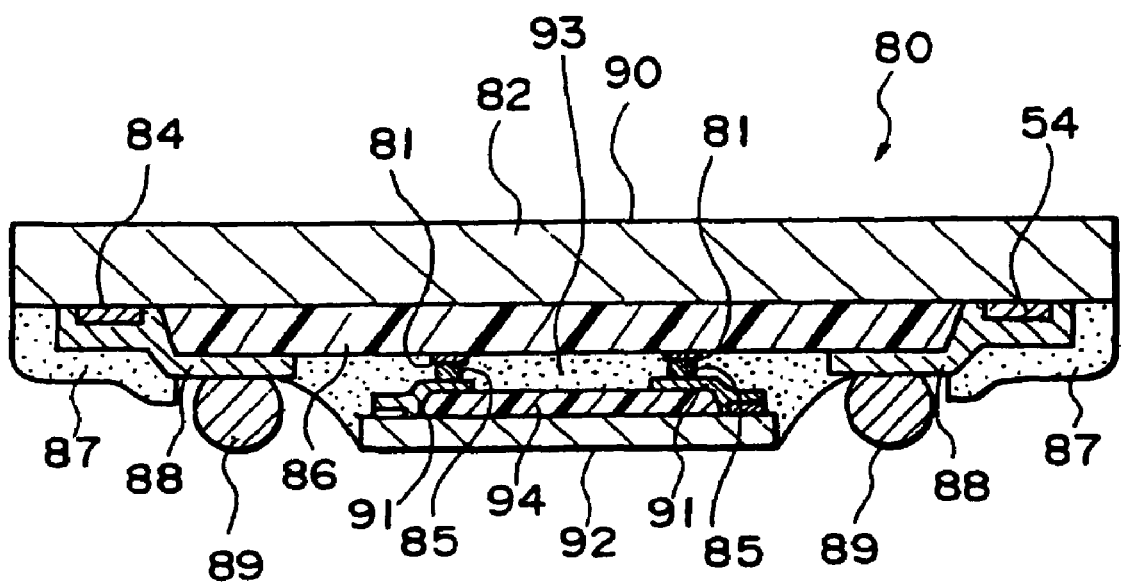
FIG. 5 shows a semiconductor device in accordance with the fifth embodiment.

FIG. 5 shows a semiconductor device in accordance with the fifth embodiment. The semiconductor device 80 shown in the figure is an integrated type device wherein a semiconductor device 90 is connected to another semiconductor device 92. Namely, a stress relieving layer 86 is provided on the surface having an electrode 84 of a semiconductor chip 82 and in the region avoiding the electrode 84, while a wire 88 is formed across the electrode 84 and the stress relieving layer 86. On top of the wire 88 above the stress relieving layer 86, a bump 89 is formed. Thus, the semiconductor device 90 is designed to relieve the stress applied to the bump 89 by means of the stress relieving layer 86. Note that the wire 88 is protected by a solder resist layer 87.

Further, in the semiconductor device 90, a pad 81 is formed on wires led from a plurality of electrodes not shown in the illustration, the pad being bonded to a wire 91 of the semiconductor device 92 through a bump 85. More specifically, a pad formed on the wire 91 is bonded to the pad 81. Similarly with the semiconductor device 90, the semiconductor device 92 has also a stress relieving layer 94. Note that the electrode-mounted side and the side end of the semiconductor device 92 are preferably protected with a resin 93.

If the fabricating steps are arranged such that the bump 85 is prepared in advance either on the pad 81 of the semiconductor device 90 or on the pad on top of the wire 91 of the semiconductor device 92, the bump formation is required only on one side, dispensing with the connecting bump on the other side to save fabricating steps as well as cost.

As with other embodiments, the pad 81 is formed on the stress relieving layer 86 and therefore is easily designed according to the present embodiment.

Sixth Embodiment

Figure 6:
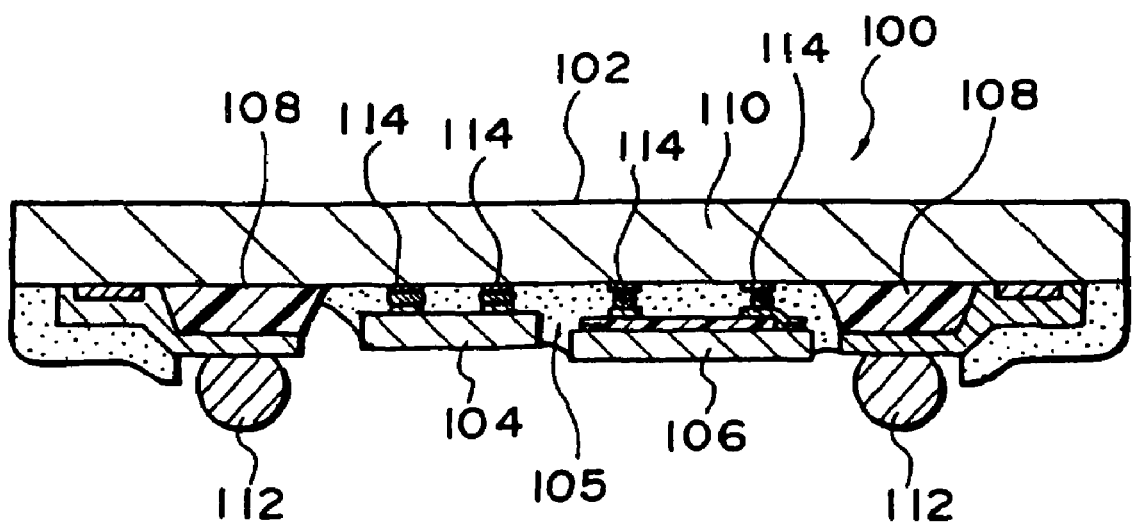
FIG. 6 shows a semiconductor device in accordance with the sixth embodiment.

FIG. 6 shows a semiconductor device in accordance with the sixth embodiment. The semiconductor device 100 shown in the figure is constituted of a semiconductor device 102 to which a bare chip 104 as a semiconductor device and a semiconductor device 106 are connected.

In the present embodiment, since the bare chip 104 is similar to the bare chip 54 shown in FIG. 4A, and the semiconductor device 106 to the semiconductor device 92 shown in FIG. 5, descriptions of these are omitted.

The semiconductor device 102 differs from the semiconductor device 90 shown in FIG. 5 with regard to the configuration of the stress relieving layer 108. As illustrated in FIG. 6, the stress relieving layer 108 is formed only in the region for forming a bump 112 on a semiconductor chip 110 of the semiconductor device 102. On the semiconductor chip 110, the stress relieving layer 108 is not provided in the central region (the region for forming active elements) wherein the bare chip 104 and the semiconductor device 106 are to be connected. Therefore, on the surface of the semiconductor chip 110 where the bare chip 104 and the semiconductor device 106 are to be connected, a pad 114 is formed on a wire led from an electrode (not shown in the illustration) with an aim of connecting the semiconductor device 102 to the bare chip 104 as well as the semiconductor device 106. Note that an isolation layer is formed underneath the pad 114. Moreover, the electrode-mounted side as well as the side end of the bare chip 104 and the semiconductor device 106 are preferably covered with protective a resin 105.

According to the present embodiment, the yield loss due to defective formation of the stress relieving layer 108 can be reduced since the stress relieving layer 108 is formed only in the region of the bump 112 for connection with the circuit board (not shown in the illustration). While the present embodiment provides a configuration in which both the bare chip 104 and the semiconductor device 106 with capability for pitch conversion and stress relieving, are connected, it is also possible to configure by connection of only one of the above-mentioned devices.

Seventh Embodiment

Figure 7:
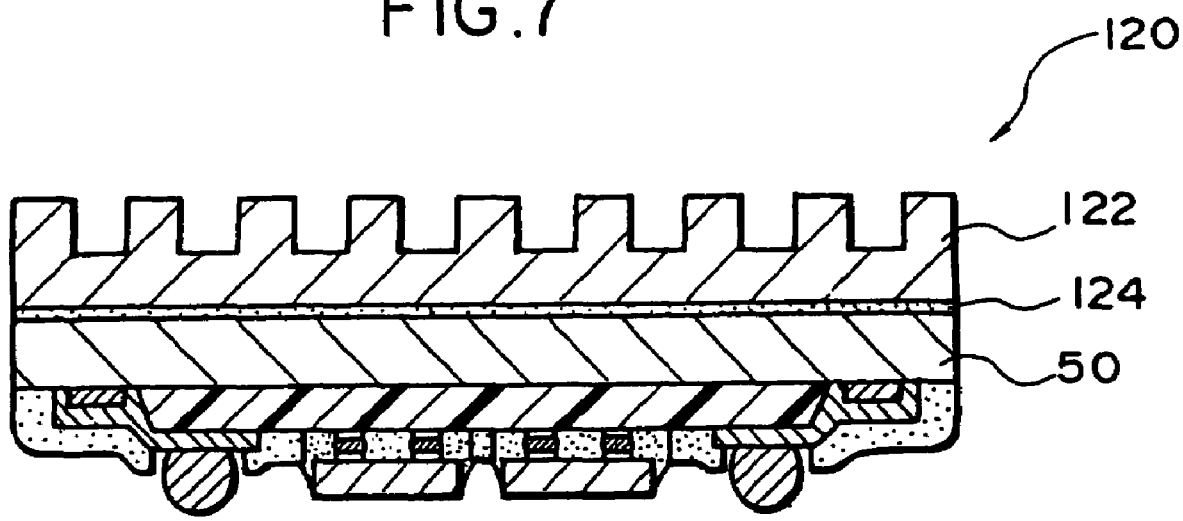
FIG. 7 shows a semiconductor device in accordance with the seventh embodiment.

FIG. 7 shows a semiconductor device in accordance with the seventh embodiment. The semiconductor device 120 shown in the figure is the semiconductor device 50 as shown in FIG. 4 attached with a heat sink 122. As the heat sink, a commonly known device is used. Also, heat conductive adhesive 124 is used to bond the semiconductor device 50 and the heat sink 122.

According to the present embodiment, the heat sink 122 improves the heat releasing performance of the device to permit an MCM configuration even for a highly integrated circuit with high heat discharge.

Other Embodiments

FIGS. 8 through 11 illustrate the steps of fabricating a semiconductor device in accordance with the present invention.

Figure 8:
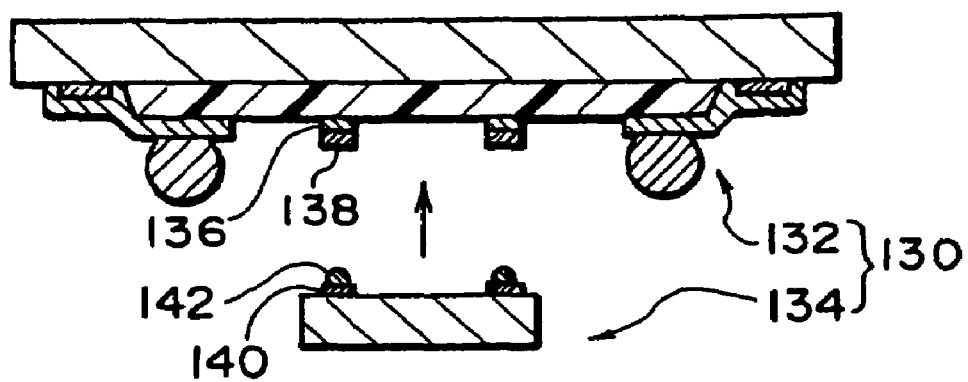
FIG. 8 is a drawing showing the steps of fabricating a semiconductor device in accordance with the present invention.

The semiconductor device 130 shown in FIG. 8 is an integrated type device comprising a semiconductor device 132 and a bare chip 134 as a semiconductor device.

The semiconductor device 132 has a configuration similar to that of the semiconductor device 52, shown in FIG. 4, except that a gold (Au) plated layer 138 is provided on a pad 136 formed on a wire led from an electrode (not shown in the illustration). Note that FIG. 8 shows the semiconductor device 132 prior to forming the solder resist layer 74 shown in FIG. 4. Also, the gold plated layer 138 may be provided by either an electroplating method or an electroless plating method.

On the bare chip 134 of the present embodiment, a bump 142 comprising gold (Au) is formed on an electrode 140 comprising aluminum (Al).

According to the present embodiment the semiconductor device 132 and the bare chip 134 are connected to form the semiconductor device 130. Specifically, the pad 136 on the semiconductor device 132 and the electrode 140 on the bare chip 134 are bonded through the plated layer 138 and the bump 142. To put it in more detail, either thermocompression bonding utilizing the diffusion generated under a given temperature and pressure, or ultrasonic bonding utilizing plastic deformation caused by ultrasonic vibration and pressure, or a combination of both is used to accomplish the connection. Afterwards, the space between the bare chip 134 and the semiconductor device 132 and also the bare chip 134 side are filled with a resin (not shown in the illustration).

Since both the plated layer 138 and the bump 142 comprise gold (Au) they have a higher melting point than solder. Accordingly, with the semiconductor device 130 of the present embodiment, even when a reflow step is performed at a temperature equal to or slightly higher than the melting point of the solder used for mounting the device onto the circuit board, the bond between the semiconductor device 132 and the bare chip 134 will not be broken since such a reflow temperature is lower than the alloy comprising gold and solder. Thus, the reliability upon mounting the device onto the circuit board is improved. Note here that metals other than gold (Au) may be used as long as the bonding is done by metal diffusion.

Figure 9:
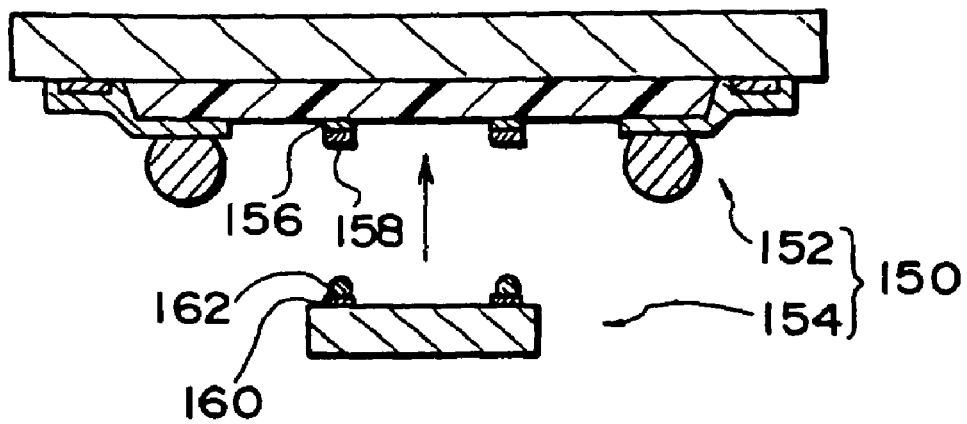
FIG. 9 illustrates the steps of fabricating a semiconductor device in accordance with the present invention.

Next, the semiconductor device 150 shown in FIG. 9 is an integrated type device comprising a semiconductor device 152 and a bare chip 154 as a semiconductor device. On the semiconductor device 152, a solder layer 158 comprising an eutectic solder is coated on the surface of a pad 156 for bonding with the bare chip 154. A thickness of only 5 to 20 μm is required for the solder layer 158. Other aspects of the configuration are the same as the semiconductor device 132 as shown in FIG. 8. Similarly with the bare chip 134 as shown in FIG. 8, a bump 162 comprising gold (Au) is formed on an electrode 160 on the bare chip 154 of the present embodiment. Note that when pitch conversion for the pads is required to connect the semiconductor device 152, configuration of a wire on the stress relieving layer instead of on the bare chip 152 may be adopted.

In the present embodiment, similarly with the aforementioned embodiment as shown in FIG. 8, the semiconductor device 152 and the bare chip 154 are bonded with thermocompression bonding or ultrasonic bonding, or with a combination of both. With such methods, gold (Au) comprised in the bump 162 diffuses into the solder layer 158 to raise the remelting temperature. Afterwards, the space between the bare chip 154 and the semiconductor device 152 and also the bare chip 154 side are filled with a resin (not shown in the illustration).

Thus, remelting of the junction is prevented at the time a reflow step is performed and the reliability of mounting the device onto the circuit board is improved.

Figure 10:
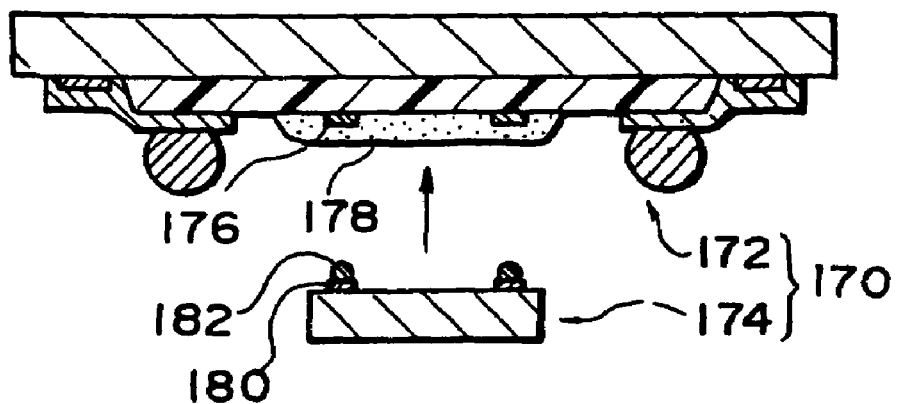
FIG. 10 also illustrates the steps of fabricating a semiconductor device in accordance with the present invention.

Next, the semiconductor device 170 shown in FIG. 10 is an integrated type device comprising a semiconductor device 172 and a bare chip 174 as a semiconductor device. On the semiconductor device 172, a flux is applied onto and around a pad 176 for bonding with the bare chip 174. Note that the pad 176 comprises a metal such as nickel (Ni), copper (Cu), and the like. Afterwards, the flux is removed by washing. Then the space between the bare chip 174 and the semiconductor device 172, and also the bare chip 174 side are filled with a resin (not shown in the illustration).

On the electrode 180 of the bare chip 174, a bump 182 comprising solder is formed. The solder constituting the bump 182 has a melting point that is higher than the one used for mounting the semiconductor device 170 onto the circuit board.

According to the present embodiment, since the solder for bonding the semiconductor device 172 and the bare chip 174 has a higher melting point than the one for mounting the device, remelting of the junction is prevented when a reflow step is performed, thereby improving the reliability of mounting the device onto the circuit board.

Figure 11:
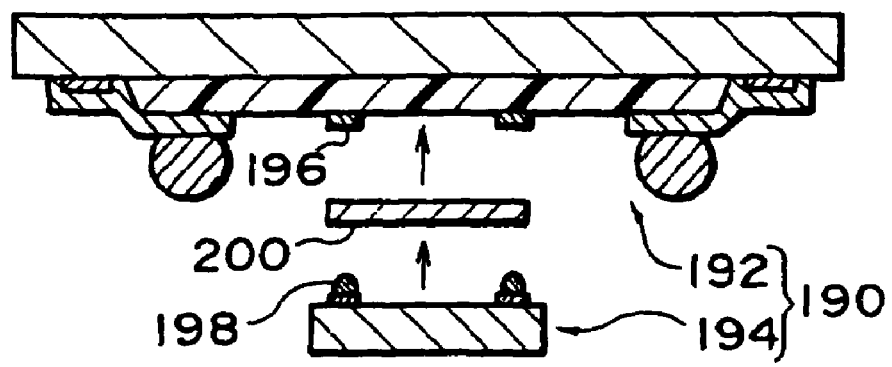
FIG. 11 continues to illustrate the steps of fabricating a semiconductor device in accordance with the present invention.

Next, the semiconductor device 190 shown in FIG. 11 is an integrated type device comprising a semiconductor device 192 and a bare chip 194 as a semiconductor device. The semiconductor device 192 has a pad 196 for bonding with the bare chip 194. Specifically, a pad with a comparatively wide area is formed in a monolithic fashion with the pad 196. The bare chip 194 has a bump 198 for bonding with the semiconductor device 192, bump 198 is to be bonded with the pad formed on the pad 196.

Additionally, in embodiments excluding the one shown in FIG. 1, defective connections occurring in other sections at the time of mounting the device onto the circuit board can be avoided, if the external terminals (such as the bump 36 and the like) are formed with a low melting point solder while the connecting sections between the semiconductor devices (such as the bump 43 and the like) are formed with a higher melting point solder; or alternatively, bumps at the connecting sections are sealed by material such as a resin after bonding, even if a solder of the same type is used for both of the above-mentioned parts.

The pad 196 comprises nickel (Ni), platinum (Pt), gold (Au) or chrome (Cr) and the like, and the bump 198 comprises copper (Cu) and the like.

In the present embodiment, an anisotropic conductive layer 200 containing thermosetting adhesive is used to bond the pad 196 and the bump 198 together. Namely, the anisotropic conductive layer 200 is placed between the pad 196 and the bump 198 to bond the two together.

In accordance with the present embodiment, since the anisotropic conductive layer 200 which bonds the semiconductor device 192 and the bare chip 194 hardens at an elevated temperature during a reflow step, preventing the junction from disconnecting, thereby to improve the reliability of mounting the device onto the circuit board. Note that a conductive or nonconductive adhesive may be used in place of the anisotropic conductive layer 200 in the present embodiment.

Figure 12:
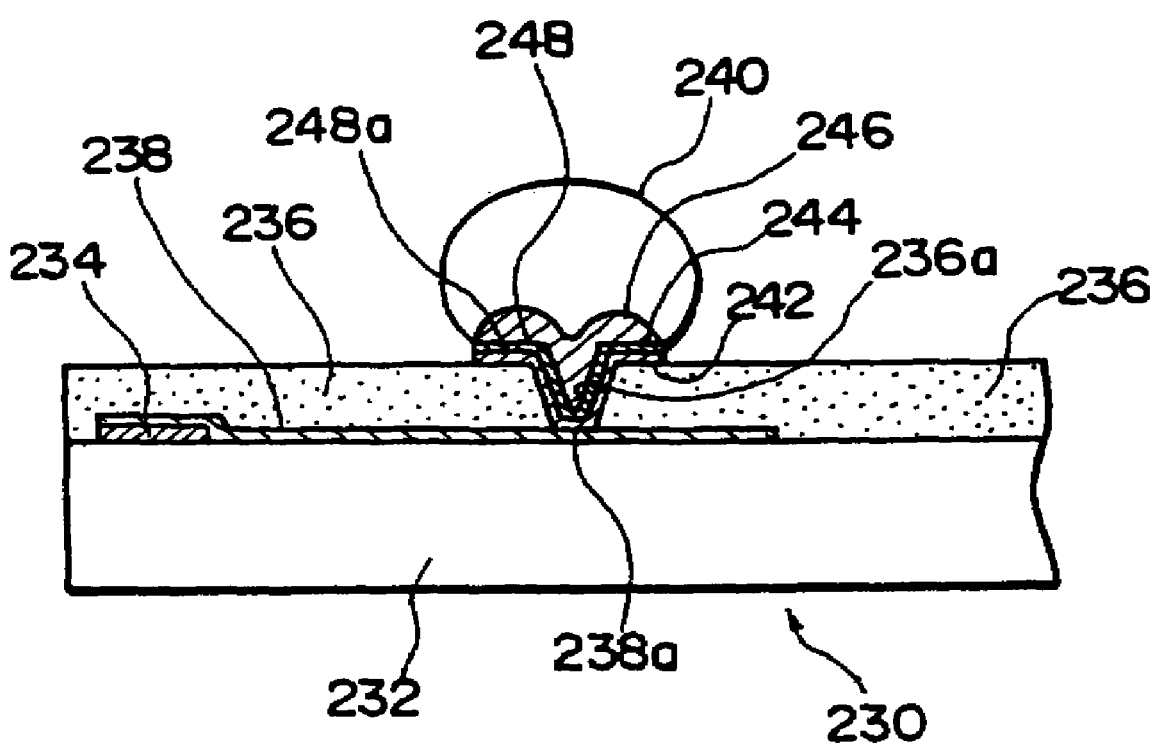
FIG. 12 is an example of a variation of the individual semiconductor devices constituting an integrated type semiconductor device.
Figure 13:
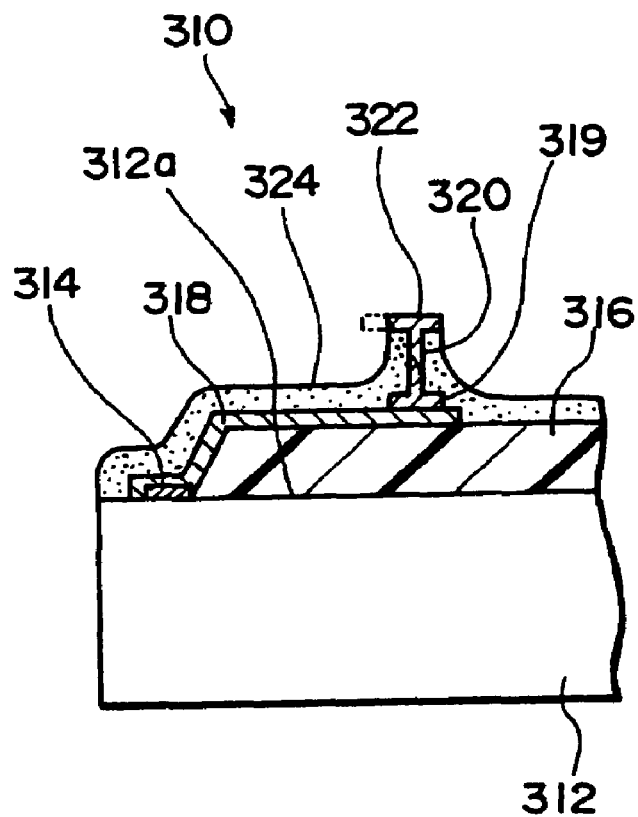
FIG. 13 is also an example of a variation of the individual semiconductor devices constituting an integrated type semiconductor device.
Figure 14:
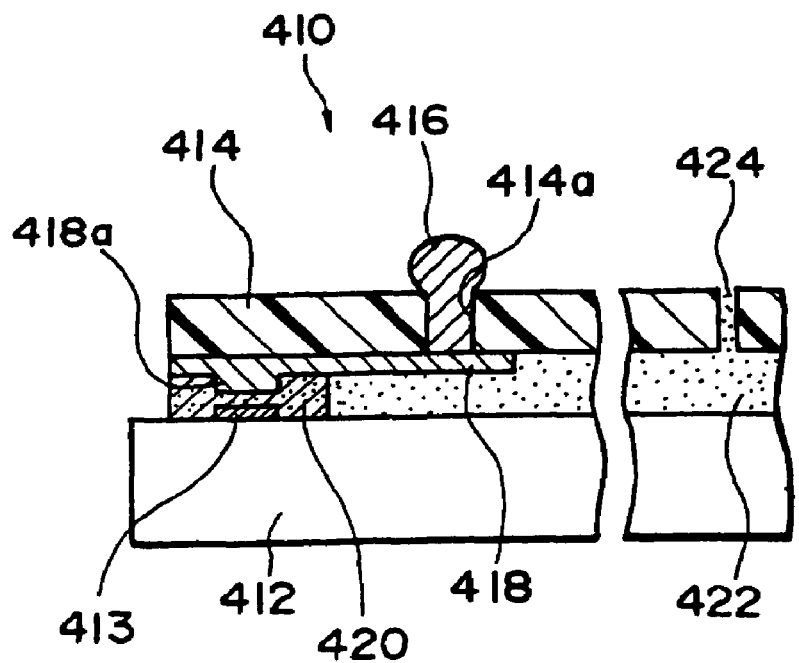
FIG. 14 is another example of variation of individual semiconductor devices constituting an integrated type semiconductor device.

FIGS. 12 through 14 show examples of variations of individual semiconductor devices constituting integrated type semiconductor devices. The following descriptions can apply to both the first semiconductor device and the second semiconductor device of the present invention.

The semiconductor device 230 shown in FIG. 12 has a wire 238 prepared underneath a stress relieving layer 236. More specifically, the wire 238 is formed across an electrode 234 on a semiconductor chip 232 and over an interposing oxide film as a dielectric layer (not shown in the illustration), on which structure the stress relieving layer 236 is prepared. Note that the wire 238 comprises chrome (Cr).

On the stress relieving layer 236, a hole 236a is formed by photolithography so that the stress relieving layer 236 does not cover the wire 238 at the region where the hole 236a is prepared. In other words, the hole 236a is formed so that the wire 238 is positioned directly underneath the hole 236a. Furthermore, a chrome (Cr) layer 242 and a copper (Cu) layer 244 are provided by sputtering across the wire 238, the inner surface of circumference that constitutes the hole 236a, and the periphery of the opening edge. In short, the chrome (Cr) layer 242 and the copper (Cu) layer 244 are provided so that they pierce through the stress relieving layer 236. Moreover, the chrome (Cr) layer 242 and the copper (Cu) layer 244 are prepared to spread to a comparatively wide area at the periphery of the opening edge.

On the copper (Cu) layer 244, a pedestal 246 comprising copper (Cu) is formed and a solder ball (external electrode) 240 is formed on the pedestal 246. The solder ball (external electrode) 240 is electrically connected to the wire 238 through the chrome (Cr) layer 242, the copper (Cu) layer 244, and the pedestal 246. In other words, the chrome (Cr) layer 242, the copper (Cu) layer 244, and the pedestal 246 provides a connecting section for the device.

According to the present embodiment, the stress transfer section 248 comprising at least a portion of the chrome (Cr) layer 242, the copper (Cu) layer 244, and the pedestal 246 acts to transfer stress from the solder ball 240 to the stress relieving layer 236. The stress transfer section 248 is located at a peripheral area outside of a connecting section 238a.

In the present variation, the stress transfer section 248 is built with a flange-like section 248a (i.e. the protruded part) as its integral part. Therefore, the stress transfer section 248 can transfer stress working to tilt the central axis of the solder ball 240 to the stress relieving layer 236 through a wide area. The wider the stress transfer section 248, the more effectively it works.

According to the present variation, since the stress transfer section 248 is located at an elevation different from that of the connecting section 238a for the wire 238, and also the connecting section 238a and the wire 238 are located on the hard oxide film, any stress generated is absorbed by the stress relieving layer 236. Since the above arrangement hinders the transfer of stress to the connecting section 238a and further to the wire 238, it helps prevent cracks from occurring.

Next, the semiconductor device 310 shown in FIG. 13 is a CSP type device comprising a stress relieving layer 316 and a wire 318 formed thereon. More specifically, on an active surface 312a of a semiconductor chip 312, the stress relieving layer 316 is formed while avoiding an electrode 314, whereas the wire 318 is formed across the electrode 314 and the stress relieving layer 316.

In the above arrangement, the stress relieving layer 316 comprises a polyimide resin which acts to relieve the stress generated when the semiconductor device 310 is mounted onto a mounting board (not shown in the illustration), due to a difference in the thermal expansion coefficients between the semiconductor chip 312 and the circuit board. Moreover, the polyimide resin has a dielectric property to protect the active surface 312a of the semiconductor chip 312 against the wire 318, and also thermal resistance to protect the surface during melting of the solder when mounting the device. Among various polyimide resins, it is preferable to use one with a low Young's modulus (such as an olefin type polyimide resin, BCB, a product of Dow Chemical, and the like), and it is particularly preferred that the Young's modulus is about 40 to 50 kg/mm$^2$. While the stress handling capability of the stress relieving layer 316 increases with its thickness, it is preferably prepared to a thickness between 1 to 100 μm, in consideration of the size of the semiconductor device and the manufacturing cost. However, when a polyimide resin having Young's modulus in the level of 40 to 50 kg/mm$^2$ is used, a thickness of about 10 μm is sufficient.

Alternatively, as the stress relieving layer 316, any material having a low Young's modulus and therefore capable of relieving stress including, for example, silicone-modified polyimide resins, epoxy resins, silicone-modified epoxy resins, and the like may be used. Another option may be to provide a passivation layer (comprising SiN, SiO$_2$, and the like) in place of the stress relieving layer 316, allowing a flexing section 320 to relieve the stress (to be described later). In this case, the stress relieving layer 316 may be used as a supplementary role.

The wire 318 of the present variation comprises chrome (Cr). In this respect, the chrome (Cr) has been chosen because of its good adhesion with the polyimide resin that constitutes the stress relieving layer 316. Alternatively, aluminum or an aluminum alloy such as aluminum-silicon, aluminum-copper, and the like, or a spreadable (with an extendable property) metal such as copper (Cu) or gold may be chosen in consideration of anti-cracking performance. Another option is to choose titanium or titanium tungsten that is excellent in moisture resistance property to prevent wire breakage due to corrosion. Titanium is also favored in regard to adhesion to polyimide. Additionally, the wire may be formed with two or more layers by combining of the above-mentioned metals.

On the wire 318, a connecting section 319 is formed on which a flexing section 320 is formed with a sectional area smaller than the connecting section 319. The flexing section 320 comprises a metal such as copper, a long and narrow shape, standing within the active surface 312a, and approximately perpendicular to the active surface. Because of its slender shape, the flexing section 320 is able to bend, as shown with the double-dot-and-dash line in the illustration.

At the tip of the flexing section 320 an external electrode section 322 is formed. The external electrode section 322 is provided for electrical connection between the semiconductor device 310 and the mounting board (not shown in the illustration), and therefore may be prepared with attachments such as a solder ball. The external electrode section 322 is prepared with dimensions that enable the electrical connection with the mounting board or the attachment of a solder ball. Alternatively, the tip portion of the flexing section 320 may be prepared as the external electrode section 322.

Further, on top of the wire 318 and the stress relieving layer 316, a solder resist 324 is provided so that it covers the entire structure above the active surface 312a. The solder resist 324 acts to protect the wire 318 and the active surface 312a from corrosion or other damages.

According to the present embodiment, the external electrode section 322 is designed to shift position as the flexing section 320 bends and deforms. With such a mechanism, any thermal stress applied to the external electrode section 322 of the semiconductor device 310 is absorbed in the deformation of the flexing section 320. In other words, the flexing section 320 provides for a stress relieving structure.

While the stress relieving layer 316 is prepared in the present embodiment, since the flexing section 320 is prepared in such a way that it is more flexible than the stress relieving layer 316, the flexing section 320 alone is able to absorb thermal stresses. Accordingly, absorption of thermal stresses can be accomplished even with a configuration wherein the stress relieving layer 316 is replaced with a layer (such as a simple dielectric layer or a protective layer) comprising a material that has no stress relieving capability.

Next, the semiconductor device 410 shown in FIG. 14 comprises a semiconductor chip 412 and a dielectric film 414 on which an external connection terminal 416 is prepared. The semiconductor chip 412 is provided with a plurality of electrodes 413. While in the present embodiment the electrodes 413 are formed only on the two opposing sides of the chip, as is well known to those skilled in the art, they may be formed on all four sides of a chip.

Specifically, the dielectric film 414 comprises a material such as polyimide resin and has a wiring pattern 418 formed on one side. Also, on the dielectric film 414, a plurality of contact holes 414a are prepared through which the external connection terminal 416 is formed over the wiring pattern 418. Accordingly, the external connection terminal 416 is designed to protrude out the opposite side of the wiring pattern 418. The external connection terminal 416 comprises a material such as solder, copper, nickel or others and is fabricated into a spherical shape.

On each of the wiring pattern 418, a convex portion 418a is formed in a one-to-one correspondence with each of the electrodes 413 of the semiconductor chip 412. Therefore, if the electrodes 413 are arranged on four sides of the semiconductor chip 412 along its outer perimeter, the convex portion 418a is also arranged in the same manner. The electrode 413 is electrically connected to the convex portion 418a so that it conducts with the external connection terminal 416 through the wiring pattern 418. Moreover, the existence of the convex portion 418a enables a wide clearance between the dielectric film 414 and the semiconductor chip 412, or the wiring pattern 418 and the semiconductor chip 412.

In the above-described configuration, the electrical connection between the electrode 413 and the convex portion 418a is achieved by using an anisotropic conductive layer 420. The anisotropic conductive layer 420 is prepared by dispersing fine metallic particles (conductive particles) into a resin, which is made into a sheet-like form. When the anisotropic conductive layer 420 is compressed between the electrode 413 and the convex portion 418a, the fine metallic particles (conductive particles) are also compressed to establish an electrical connection between the two. It is noted here that, with the anisotropic conductive layer 420, electrical conduction is established only in the direction to which the fine metallic particles (conductive particles) are compressed. Therefore, even if a sheet form anisotropic conductive layer 420 is provided over a plurality of electrodes 413, electrical conduction does not occur between any two juxtaposing electrodes 413.

While the anisotropic conductive layer 420 in the present embodiment is provided between the electrode 413 and the convex portion 418a and its vicinity, it may be limited only to the area between the electrode 413 and the convex portion 418a. Additionally, within the clearance between the dielectric film 414 and the semiconductor chip 412, a stress relieving section 422 is formed to provide a stress relieving structure. The stress relieving section 422 is formed by injecting a resin through a gel injection hole 424 prepared on the dielectric film 414.

As for the resin constituting the stress relieving section 422, materials having a low Young's modulus and thus capable of relieving stress are used. For such materials, polyimide resins, silicone resins, silicone-modified polyimide resins, epoxy resins, silicone-modified epoxy resins, acrylic resins and the like can be mentioned by way of example. Accordingly, the stress relieving section 422 can relieve outside stress applied to the external connection terminal 416.

The following is a description of the principal steps of fabricating the semiconductor device 410 of the present embodiment. First, contact holes 414a for external connection terminals 416 and gel injection holes 424 are prepared on a dielectric film 414. Subsequently, a copper foil is pasted onto the dielectric film 414 and then etched to form a wiring pattern 418, thereupon the area for forming convex portions 418a is masked and the remaining area is etched to make it thinner. Removing the aforementioned mask thus leaves the convex portions 118a.

Further, over the convex portions 418a on top of the dielectric film, an anisotropic conductive layer 420 is provided. More specifically, for a plurality of convex portions 418 arranged along two opposing sides, the anisotropic conductive layer 420 is affixed in two parallel lines, whereas for the convex portions 418a lining the four sides, the anisotropic conductive layer 420 is affixed as if to draw a corresponding rectangle.

The above-mentioned dielectric film 414 is pressed upon the semiconductor chip 412, while matching the convex portions 418a and the electrodes 413, so that the anisotropic conductive layer 420 is compressed between the convex portions 418a and the electrodes 413. Thus establishing the electrical connection between the convex portions 418a and the electrodes 413.

Subsequently, a resin is injected through the gel injection hole 424 into the space between the dielectric film 414 and the semiconductor chip 412 to form the stress relieving section 422.

Finally, by applying solder on the wiring pattern 418 through the contact holes 414a, external connection terminals 416 are prepared in a spherical shape.

The semiconductor device 410 is fabricated in the aforementioned steps. It should be noted that, in place of the anisotropic conductive layer 420 used in the present variation, an isotropic adhesive may be used. An isotropic adhesive has a composition similar to an anisotropic conductive layer 420 except that it is not in sheet form.

Alternatively, the convex portions 418a and the electrodes 413 may be press fitted together by compressing a nonconductive type adhesive between the convex portions 418a and the electrodes 413. Another option is to dispense with the convex portions 418a on the dielectric film 414 and instead to use bumps comprising gold, solder, or the like prepared on the electrodes 413.

Figure 15:
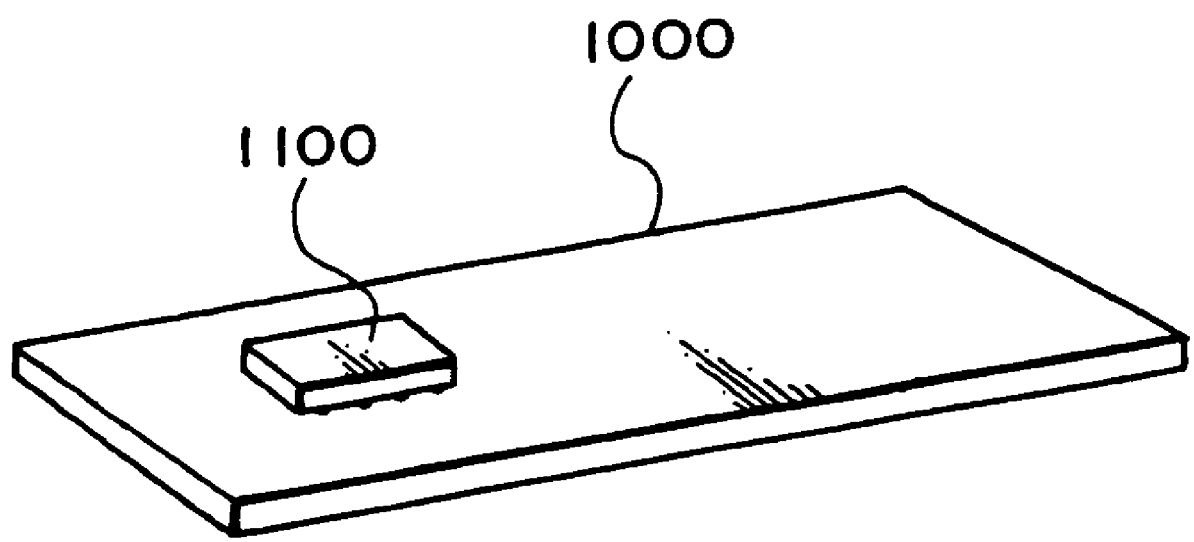
FIG. 15 illustrates a circuit board mounted with a semiconductor device in accordance with the present invention.

FIG. 15 illustrates the circuit board 1000 mounted with a semiconductor device 1100 in accordance with the present invention. For the circuit board 1000, organic type boards such as a glass-epoxy board for example are generally used. On the circuit board 1000, wiring patterns constituting copper, for example, are formed to provide a desired circuitry. These wiring patterns are then mechanically connected with the bumps on the semiconductor device 1100 to establish electrical conduction between them. In this instance, the semiconductor device 1100 is equipped with the aforementioned structure to absorb strains caused by the thermal expansion differential between itself and an outside unit, thereby improving the reliability of mounting the semiconductor device 1100 of the present embodiment onto the circuit board 1000 and thereafter. Additionally, if the wire on the semiconductor device 1100 is fabricated with appropriate considerations, its reliability during or after connection can be improved. Moreover, the size of the area for mounting the device can be reduced to the area required for mounting a bare chip. The circuit board 1000 can therefore be used to miniaturize electronic appliances. Alternatively, given the same available area, a wider mounting space is secured which can be utilized for advanced functions or performance.

While in the foregoing embodiments after the second embodiment, the flanks and the rear sides of the semiconductor chips are exposed, these exposed parts (rear and flanks) may be covered with materials such as epoxy or polyimide resins, if damage to the semiconductor chip is an issue. Further, although solder bumps are used by way of example in describing methods for bonding with the circuit board, bumps may comprise gold or other metals, or protrusions using conductive resins could as well be equally applied.

Figure 16:
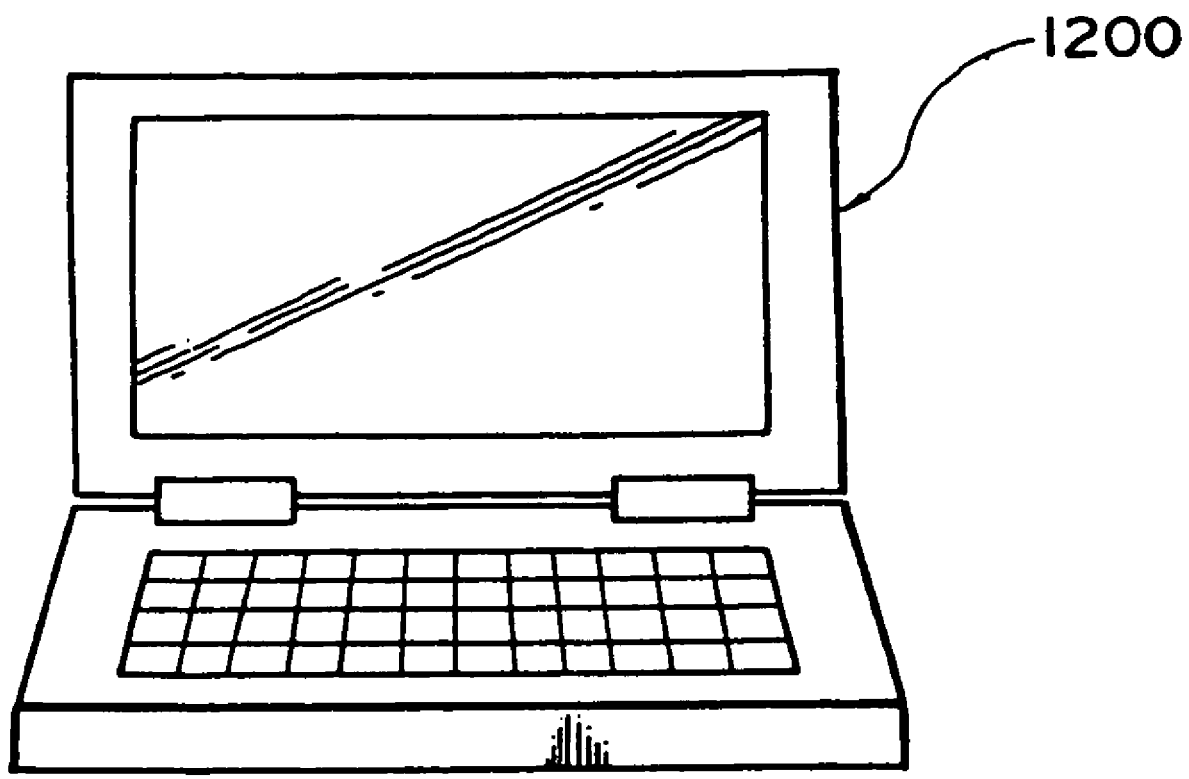
FIG. 16 illustrates an electronic appliance equipped with a circuit board mounted with a semiconductor device in accordance with the present invention.

As an electronic appliance equipped with the circuit board 1000, a notebook-sized personal computer 1200 is illustrated in FIG. 16.

It should be noted that, while the above-described embodiments are examples wherein the present invention is applied to semiconductor devices, the present invention could as well be applied equally to other electronic components inasmuch as they require a multitude of bumps for planar mounting, regardless of whether they may be active components or passive components. As examples of such electronic components, resistors, capacitors, coils, oscillators, filters, temperature sensors, thermistors, varistors, potentiometers, fuses, and others can be mentioned.

The present invention, in addition to combinations between semiconductor chips, could as well be applied equally to applications combining an electronic component and a semiconductor chip, as well as combinations of electronic components. The stress-relieving structure may be provided either on one side or on both sides of such combinations.

What is claimed is:

1. An integrated type semiconductor device comprising:
   a first semiconductor device that includes a first semiconductor chip, a plurality of first electrodes, a resin layer, a plurality of wires, an external electrode and a connecting portion, the plurality of first electrodes being formed on a first surface of the first semiconductor chip, the resin layer being provided on the first surface of the first semiconductor chip, each of the plurality of wires being electrically connected to at least one of the plurality of first electrodes, the plurality of wires including a first wire and a second wire, a first part of the first wire being formed beneath the resin layer, the connecting portion piercing through the resin layer, the connecting portion being formed on a second part of the first wire, the external electrode being formed on the connecting portion and connected to the first wire via the connecting portion; and
   a second semiconductor device that includes a second semiconductor chip and a second electrode, the second electrode being formed on a first surface of the second semiconductor chip, the second electrode being electrically connected to the second wire, the first surface of the second semiconductor chip facing the first surface of the first semiconductor chip.

2. An integrated type semiconductor device comprising:
   a first semiconductor device that includes a first semiconductor chip, a plurality of first electrodes, a first resin layer a plurality of wires and an external electrode, the first resin layer being provided on the first semiconductor chip, each of the plurality of wires electrically connected to at least one of the first electrodes, the plurality of wires including a first wire and a second wire, the external electrode being formed over the first resin layer and connected to the first wire; and
   a second semiconductor device that includes a second semiconductor chip, a second electrode, a second wire, a second resin layer, a connecting portion and a bump, the second resin layer being formed on the second semiconductor chip, the second wire being electrically connected to the second electrode, a first part of the second electrode being formed underneath the second resin layer, the connecting portion piercing through the second resin layer, the connecting portion being formed on a second part of the second wire, the bump being formed on the connecting portion, the bump being connected to the second wire.

3. The integrated type semiconductor device according to claim 1, further comprising:
   a radiator that is attached to a second surface of the first semiconductor chip opposite to the first surface of the first semiconductor chip.

4. The integrated type semiconductor device according to claim 2, further comprising:
   a radiator that is attached to a first surface of the first semiconductor chip opposite to a second surface on which the plurality of first electrodes is formed.

5. The integrated type semiconductor device according to claim 1, the external electrode being made from a solder.

6. The integrated type semiconductor device according to claim 2, the external electrode being made from a solder.

7. The integrated type semiconductor device according to claim 1, further comprising:
   a second resin layer that is positioned between the first semiconductor chip and the second semiconductor chip.

8. The integrated type semiconductor device according to claim 7, a third surface of the second semiconductor chip connecting the first surface of the second semiconductor chip and a second surface of the second semiconductor chip opposite to the first surface of the second semiconductor chip, the second resin layer covering at least a part of the third surface of the second semiconductor chip.

9. The integrated type semiconductor device according to claim 2, further comprising:
   a third resin layer that is positioned between the first semiconductor chip and the second semiconductor chip, the third resin layer covering at least a part of a first surface of the second semiconductor chip on which the second electrode is formed.

10. The integrated type semiconductor device according to claim 9, a third surface of the second semiconductor chip connecting the first surface of the second semiconductor chip and a second semiconductor chip opposite to the second semiconductor chip, the third resin layer covering at least a part of the third surface of the second semiconductor chip.

* * * * *